United States Patent [19]

Mihara

[11] Patent Number: 4,823,172
[45] Date of Patent: Apr. 18, 1989

[54] VERTICAL MOSFET HAVING SCHOTTKY DIODE FOR LATCH-UP PREVENTION

[75] Inventor: Teruyoshi Mihara, Yokosuka, Japan
[73] Assignee: Nissan Motor Company, Ltd., Yokohama, Japan
[21] Appl. No.: 60,224
[22] Filed: Jun. 10, 1987
[30] Foreign Application Priority Data Jun. 17, 1986 [JP] Japan .................... 61-139122

[51] Int. Cl.$^4$ ............................ H01L 29/48
[52] U.S. Cl. ...................... 357/15; 357/42; 357/41; 357/86; 357/23.4
[58] Field of Search ............ 357/23.4, 42, 41, 86, 357/15, 52

[56] References Cited

U.S. PATENT DOCUMENTS

| 4,156,246 | 5/1979 | Pedersen | 357/86 X |
| 4,300,152 | 11/1981 | Lepseuter | 357/42 |
| 4,466,176 | 8/1984 | Temple | 357/23.4 X |
| 4,513,309 | 4/1985 | Cricchi | 357/42 |
| 4,686,551 | 8/1987 | Mihara | 357/23.4 |
| 4,889,647 | 8/1987 | Nakagawa et al. | 357/15 X |

OTHER PUBLICATIONS

Goodman et al., "Improved COMFETs with Fast Switching Speed and High-Current Capability", *IEEE, IEDM83*, pp. 79–82, 1983.
Ohashi et al., "Basic Characteristics of Bipolar-Mode MOSFET", *SSD85-22*, pp. 1–7, 1985.

*Primary Examiner*—Andrew J. James
*Assistant Examiner*—William A. Mintel
*Attorney, Agent, or Firm*—Foley & Lardner, Schwartz, Jeffery, Schwaab, Mack, Blumenthal & Evans

[57] ABSTRACT

In a vertical MOSFET of a conductivity modulated type or a standard type, including an n epitaxial layer grown on a p$^+$ or n$^+$ substrate, a p type channel region, and an n$^+$ source region, there is further provided a Schottky diode which is formed between the n epitaxial layer and a metal source electrode extending through the source region and channel region and reaching the epitaxial layer under the source and channel regions in order to prevent latch-up of a parasitic thyristor.

15 Claims, 4 Drawing Sheets

VERTICAL MOSFET HAVING SCHOTTKY DIODE FOR LATCH-UP PREVENTION

CROSS REFERENCE TO RELATED APPLICATION

A U.S. application, Ser. No. (022,967), filed on Mar. 6, 1987 for "SEMICONDUCTOR DEVICE OF MOSFET TYPE", and based on a prior Japanese application No. 61-74163, relates subject to matter similar to that of the present application.

BACKGROUND OF THE INVENTION

The present invention relates to vertical type power MOSFETs (metal-oxide semiconductor field effect transistors) designed to prevent, or reduce the risk of, latch-up.

The vertical MOSFETs are used as power switching elements. However, it is difficult to increase a withstand voltage of a standard vertical MOSFET without increasing its on resistance. Recently, a new vertical MOSFET has been developed and appeared in the market. The new device is designed to overcome the disadvantage of the standard vertical MOSFET by utilizing conductivity modulation. This new device is known as a conductivity modulated MOSFET or a bipolar mode MOSFET.

FIGS. 6 and 7 show one conventional example of the conductivity modulated MOSFETs (disclosed in IEEE, IEDM 83, pages 79–82).

The semiconductor device of FIG. 6 is composed of an epitaxial substrate 1 which consists of a P+-type Si substrate 2 serving as a drain region, and an n-type base layer 3 formed on the P+ substrate 2 by epitaxial growth. The impurity concentration, and thickness of the epitaxial layer 3 are chosen in accordance with the required withstand voltage.

In a principal surface of the epitaxial substrate 1, there are formed a p-type semiconductor channel region 4, a p+-type semiconductor base region 5, and an n+-type semiconductor source region 6 straddling the channel region 4 and the base region 5.

The vertical MOSFET of FIG. 6 is the n-channel type. Therefore, the n epitaxial layer 3 serves, in effect, as a drain region. In the conductivity modulation type of MOSFETs, however, this epitaxial layer 3 is called an n-type base layer because of its operation.

A gate electrode 8 is formed above the channel region 4 lying between the n+ source region 6 and the n base epitaxial layer 3, and separated from the channel region 4 by a gate insulating oxide layer 7.

The device of FIG. 6 further includes a PSG intermediate insulating layer 9, a source electrode 11 and a drain electrode 12. The source electrode 11 is connected to the channel region 4 through the n+ source region 6 and the P+ base region 5. The drain electrode 12 is formed on the bottom of the p+ substrate 2.

Such a conductivity modulated device has an advantage that it can possess high withstand voltage and low on-resistance simultaneously. In the standard vertical MOSFET in which the p+ drain region 2 is replaced by an n+-type region, the resistance of the n base epitaxial layer 3 increases in proportion to the withstand voltage raised to the power of 2.7, so that it is difficult to attain a sufficiently low on resistance when the withstand voltage is 400 V or more.

In the device of FIG. 6, there is formed a parasitic pnpn thyristor structure composed of a parasitic pnp transistor $Q_1$ and a parasitic npn transistor $Q_2$ as shown in FIG. 6. Both transistors $Q_1$ and $Q_2$ are connected as shown in an equivalent circuit of FIG. 7. A resistance Rb shown in FIG. 7 is a base resistance of the transistor $Q_2$, which is formed in the p+ base region 5 and the channel region 4.

When a predetermined positive voltage is applied to the drain electrode 12, and a gate-source voltage equal to or greater than a threshold voltage is applied between the gate electrode 8 and the source region 6, then a surface layer of the channel region 4 immediately below the gate electrode 8 becomes conductive. Therefore, electrons flow from the n+ source region 6 through the channel region 4 into the n base layer 3. On the other hand, a large number of holes are injected from the p+ drain region 2 into the n base layer 3.

A part of the holes injected into the n base layer 3 recombine with the electrons coming from the channel region 4, and a part of the holes flow into the p+ base region 5 and the channel region 4, and reach the source electrode 11. Nevertheless, a large number of carriers are stored in the n base layer 3. As a result, the conductivity of the n base layer 3 is modulated, or increased, and the on resistance of the device is dramatically reduced.

The conductivity modulated MOSFET is very advantageous in that its on resistance is very low, and therefore it can handle higher current level. However, this new device has a problem of latch up. If the output current of the device is increased in such a extent as to cause a voltage drop developed by the base resistance Rb to exceed a base threshold voltage (0.6 V, for example), then the transistor $Q_2$ is turned on, so that the transistor $Q_2$ increases its collector current, that is, a base current of the other transistor $Q_1$. As a result, latch-up is caused by formation of a positive feedback loop in which the base current of the transistor $Q_2$ is increased by increase of the collector current $Ic_1$ of the transistor $Q_1$. Latch-up is very harmful since it is necessary to cut off the power supply in order to restore the thyristor once switched to latch-up, to the original state.

The condition for triggering latch-up is expressed as:

$$Ic_1 \cdot Rb \geq 0.6 \text{ (V)}$$

Therefore, in order to prevent latch up, it is important to minimize the collector current $Ic_1$ of the transistor $Q_1$ and/or the base resistance Rb.

FIG. 8 shows another conventional example of the conductivity modulated vertical MOSFETs (disclosed in H. Ohashi et al. "Basic Characteristics of Bipolar-Mode MOSFET", Denshi Tsushin Gakkai Gijutsu Hokoku, SSD85-22, pages 1–7, 1985). In the device of FIG. 8, there are additionally provided an n+ buffer layer 17 formed by epitaxial growth between the p+ drain substrate region 2 and the n base layer 3, and one or more bypass regions 18 formed in the channel region 4.

The n+ buffer layer 17 is intended to reduce the collector current $Ic_1$ of the transistor $Q_1$ by restricting the efficiency of injecting holes from the p+ drain region 2 into the n base layer 3. The bypass regions 18 are intended to obtain an effect equivalent to reduction of the base resistance Rb by providing a low resistance bypass for the hole current However, the conductivity modulated MOSFET structure of FIG. 8 is disadvantageous in that its on resistance is increased by the n+ buffer layer 17 and the bypass region 18, and that the fabrication of the device is complicated by a double epitaxial growth process for forming the n+ buffer layer 17.

SUMMARY OF THE INVENTION

It is an object of the present invention to provide a vertical MOSFET which is easy to fabricate and which has a low on resistance and a superior capability in withstanding latch-up due to parasitic transistors.

According to the present invention, a vertical MOS field effect semiconductor device comprises a semiconductor substrate, a drain electrode, a semiconductor channel region, a semiconductor source region, a gate electrode and a metal source electrode. The substrate comprises a first semiconductor layer of a first conductivity type. The substrate has a first surface formed by the first layer, and a second surface. The drain electrode is formed on the second surface of the substrate. The channel region is a second conductivity type opposite to the first type, and formed in the first semiconductor layer. The source region is the first conductivity type, and surrounded by the channel region. The gate electrode is formed above the channel region between the source region and the first semiconductor layer, and separated from the channel region by a gate insulating layer. The metal source electrode has a first portion extending through the source region and the channel region and terminating at an innermost end which forms a first Schottky junction with the first layer.

DETAILED DESCRIPTION OF THE INVENTION

Figure 1:
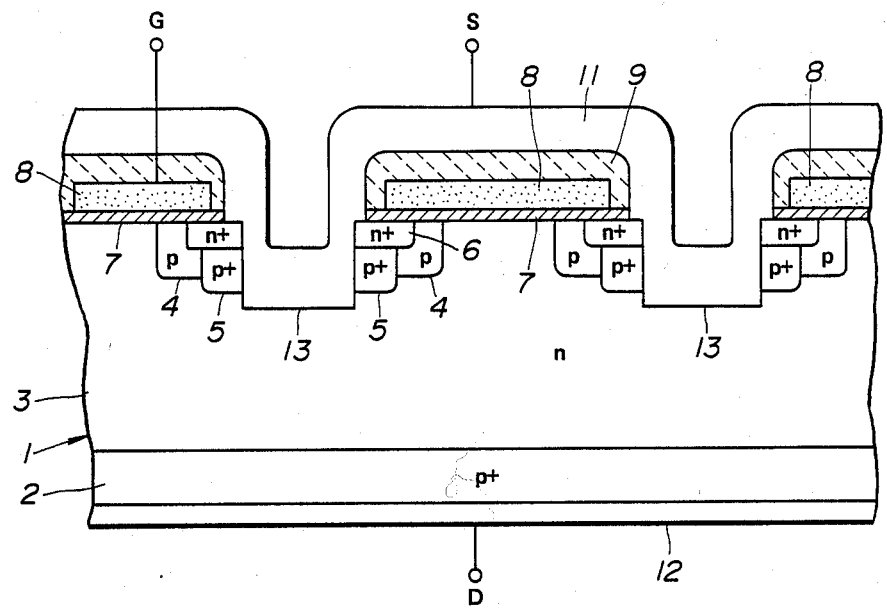
FIG. 1 is a cross sectional view showing the structure of a vertical MOSFET of a first embodiment of the present invention.
Figure 2:
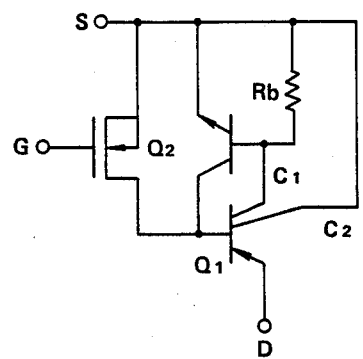
FIG. 2 is a diagram of an equivalent circuit of the semiconductor device shown in FIG. 1.

A first embodiment of the present invention is shown in FIGS. 1 and 2. A semiconductor device of this embodiment is a vertical MOSFET of a conductivity modulated type.

The semiconductor device of this embodiment has a semiconductor epitaxial substrate 1 consisting of an n-type first layer 3 and a p+-type second layer 2, a gate insulating layer 7, a gate electrode 8, an intermediate insulating layer 9, a source electrode 11, a drain electrode 12, and at least one group of a p-type channel region 4, a p+-type base region 5 and an n+-type source region 6. The second layer 2 of the epitaxial substrate 1 is a p+ Si original substrate, and the first layer 3 is an epitaxial layer grown on the original substrate 2. These parts 2-9, 11 and 12 are formed substantially in the same manner as in the conventional device shown in FIG. 6.

The semiconductor device of FIG. 1 is different from the conventional device of FIG. 6 in the following points.

The source electrode 11 of this embodiment has at least one first portion extending through the n+ source region 6 and the p+ base region 5, and terminating at an innermost end. The inner first portion of the source electrode 11 is formed in a depression formed in the semiconductor part of the device. The depression pierces a central part of the source region 6 and a central part of the base region 5, and reaches the epitaxial layer 3. The inner first portion of the source electrode 11 is surrounded by the source region 6 and the base region 5.

The source electrode 11 of this embodiment is made of aluminum (Al). The inner first portion of the Al source electrode 11 is in ohmic contact with the highly doped n+ source region 6 and the p+ base region 5. The innermost end of the first portion of the source electrode 11 forms a first Al-nSi Schottky junction 13 with the lightly doped n base epitaxial layer 3.

The forward direction of the Schottky barrier diode 13 is from the Al source electrode 11 to the n-type base semiconductor region 3, and its barrier height $\phi_{ms}$ is lower than that of a semiconductor to semiconductor pn junction.

In the MOSFET structure of FIG. 1, the central portion of the p+ base region 5 is removed, and the metal source electrode 11 is formed in the place of the central portion of the p+ base region 5, and joined with the n base epitaxial layer 3 to form the Schottky barrier diode 13. Therefore, the structure of FIG. 1 can decrease the base resistance Rb of the parasitic transistor $Q_2$. Furthermore, the Schottkty diode 13 performs a function electrically equivalent to a second collector $C_2$ of the parasitic transistor $Q_1$ as shown in FIG. 2. In FIG. 2, $C_1$ denotes a first collector of the transistor $Q_1$ formed by the p+ base region 5 and other parts excluding the Schottky diode 13.

The semiconductor device of the first embodiment can be fabricated in the following manner.

Figure 6:
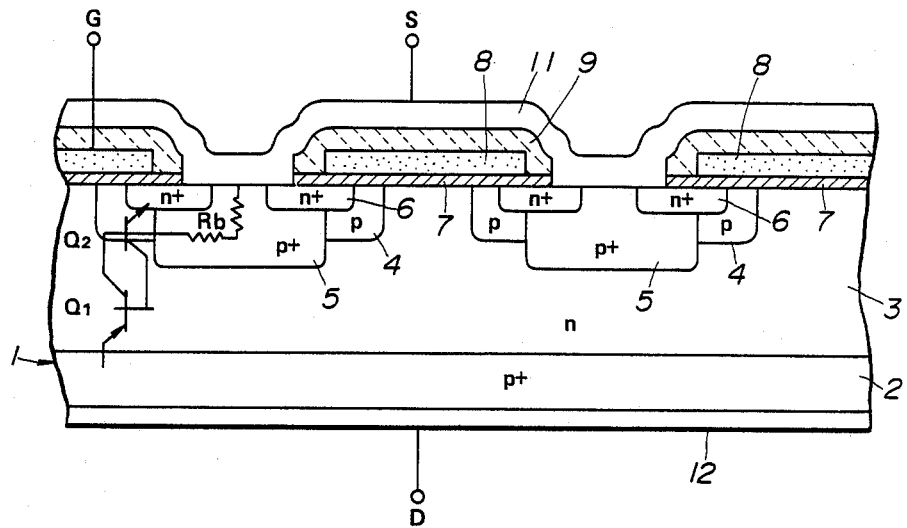
FIG. 6 is a cross sectional view showing a vertical MOSFET of a conventional type.
Figure 7:
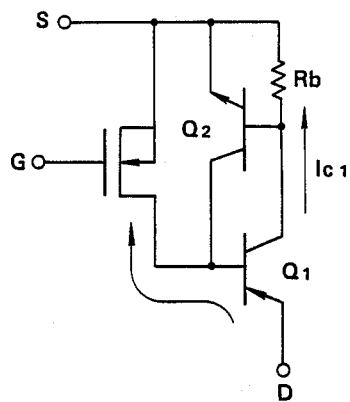
FIG. 7 is a diagram of an equivalent circuit of the conventional device of FIG. 6.
Figure 8:
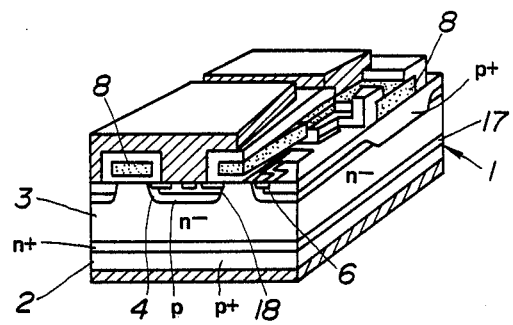
FIG. 8 is a partially cutaway perspective view showing another conventional vertical MOSFET.

In the same manner as in the conventional device of FIG. 6, the p-type channel region 4 and the p+ base region 5 are formed in the n base epitaxial layer 3 of the epitaxial substrate 1, and then the n+ source region 6 is formed in the channel region 4.

Thereafter, the depression is formed centrally in the p+ base region 5 by a known reactive ion etching (RIE), or a liquid etching using EPW (ethylenediamine-pyrocatechol-water). Then, the intermediate insulating layer 9 is deposited, and a contact hole is formed at a predetermined position. Finally, the source electrode and interconnection are formed by depositing an Al layer and patterning the Al layer.

The semiconductor device of this embodiment is operated in the following manner. When a positive voltage of a predetermined magnitude is applied to the drain electrode 12, and a gate to source voltage greater than a threshold voltage is applied between the gate electrode 8 and the source region 6, then a surface layer of the channel region 4 immediately below the gate electrode 8 becomes conductive, so that electrons pass from the n+ source region 6 through the channel region 4 into the n base epitaxial layer 3.

On the other hand, a great number of holes are injected from the p+ drain layer 2 into the n base epitaxial layer 3. A part of the holes in the n base layer 3 arrive at the p+ base region 5, the channel region 4 or the Schottky diode 13, and go out through the source electrode 11 while a part of the holes recombine with the electrons flowing from the channel region 4. During this, the carriers are accumulated in great quantities in the n base layer 3. These excess carriers modulate the conductivity of the n base layer 3, and sharply decrease the on resistance of the device.

In the semiconductor device of FIG. 1, the base resistance Rb of the transistor $Q_2$ is reduced. Moreover, the current through the base resistance Rb is reduced by the Schottky diode 13 which serves as a hole collector, and allows the hole current to flow out through the second collector $C_2$ of the transistor $Q_1$ and bypass the base resistance Rb. The reduction of the base resistance Rb and the reduction of the current through the base resistance Rb are both effective for restraining increase of the base potential of the transistor $Q_2$. Therefore, the structure of this embodiment can prevent the operation of the thyristor composed of the transistors $Q_1$ and $Q_2$ by preventing the operation of the second transistor $Q_2$, and significantly improve the capability of withstanding latch-up.

Figure 3:
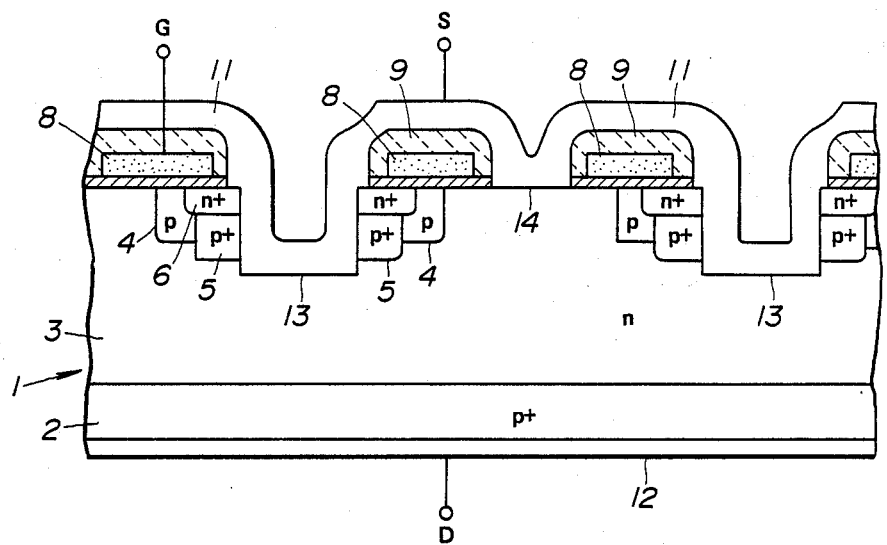
FIG. 3 is a cross sectional view showing the structure of a vertical MOSFET of a second embodiment of the present invention.
Figure 4:
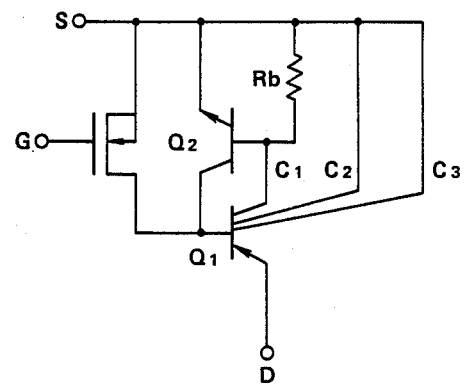
FIG. 4 is a circuit diagram showing an equivalent circuit of the semiconductor device of FIG. 3.

A second embodiment of the present invention is shown in FIGS. 3 and 4. A semiconductor device of the second embodiment is basically identical to the device of the first embodiment, but the device of the second embodiment is further provided with a second Schottky junction 14 in addition to the first Schottky junction 13.

As shown in FIG. 3, the second Schottky junction 14 is formed between the top surface of the n base epitaxial layer 3 and the metal source electrode 11. As shown in FIG. 4, the second Schottky junction 14 serves as a collector $C_3$ of the parasitic transistor $Q_1$ in the same manner as the first Schottky junction 13 formed on the bottom of the depression.

In the second embodiment, the current flowing through the base resistance Rb is further reduced as compared with the first embodiment. Therefore, the structure of the second embodiment can further improve the capability of withstanding latch-up, and further widen the safe operating area of the semiconductor device.

Figure 5:
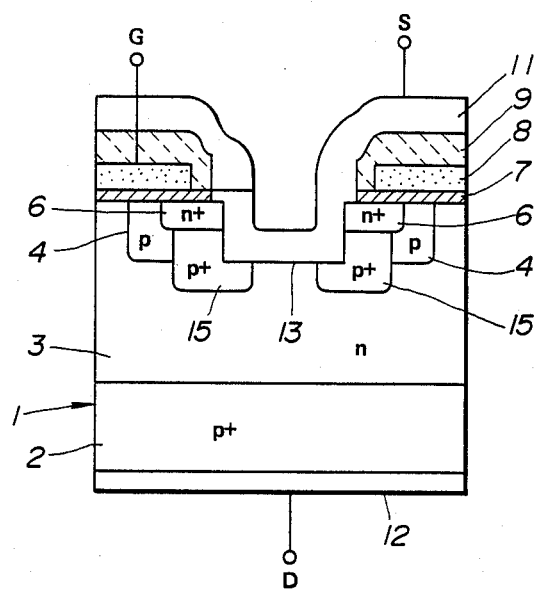
FIG. 5 is a cross sectional view showing a vertical MOSFET of a third embodiment of the present invention.

A third embodiment of the present invention is shown in FIG. 5. In the third embodiment, the p+ base region is made deeper than the first Schottky unction 13, and formed into a p+ guard ring 15 around the first Schottky junction 13, as shown in FIG. 5.

The p+ guard ring 15 serves to guard the periphery of the Schottky diode 13 electrically, and prevent concentration of the electric field at the edge of the Schottky diode 13. Therefore, the third embodiment can provide a vertical MOSFET having a great current output characteristic and a high withstand voltage (about 1000 V or more, for example).

In the preceding embodiments, the present invention is applied to the vertical MOSFET of the conductivity modulated type. However, the present invention is applicable also to the standard type vertical MOSFET in which an n− epitaxial layer is formed on an n+ substrate rather than on a p+ substrate.

In such a standard vertical MOSFET, there is formed a parasitic transistor having a collector formed by the n− epitaxial layer, a base formed by the p channel region, and an emitter formed by the n+ source region.

The present invention, when applied to the standard vertical MOSFET, can prevent the operation of the parasitic transistor by decreasing the base resistance of the parasitic transistor, formed in the channel region, improve the capability of withstanding second break down, and widen the safe operating area of the device.

What is claimed is:

1. A vertical MOS filed effect semiconductor device comprising:
    a substrate comprising a first semiconductor layer of a first conductivity type, said substrate having a first surface formed by said first semiconductor layer, and a second surface,
    a drain electrode formed on said second surface of said substrate,
    a channel region of a second conductivity type opposite to said first conductivity type, formed in said first semiconductor layer,
    a source region of said first conductivity type, surrounded by said semiconductor channel region,
    a gate electrode formed above said channel region between said source region and said first semiconductor layer, and separated from said channel region by a gate insulating layer, and
    a metal source electrode having a first portion extending into said substrate from said first surface, passing through said source region and said channel region and terminating at an innermost end which forms a first Schottky junction with said first semiconductor layer at a location remote from said first surface.

2. A semiconductor device according to claim 1 wherein said first portion of said source electrode is formed in a depression bored through said source region and said channel region.

3. A semiconductor device according to claim 2 wherein said device further comprises a highly doped semiconductor base region of said second conductivity type, formed under said source region and surrounded by said channel region, said first portion of said source electrode extending through said base region.

4. A semiconductor device according to claim 3 wherein said first portion of said source electrode is in ohmic contact with said source region and said base region.

5. A semiconductor device according to claim 4 wherein said substrate further comprises a second semiconductor layer having said second surface of said substrate.

6. A semiconductor device according to claim 5 wherein said first conductivity type is an n type, and said second conductivity type is a p type.

7. A semiconductor device according to claim 6 wherein said second semiconductor layer of said substrate is said p type.

8. A semiconductor device according to claim 6 wherein said second semiconductor layer of said substrate is said n type.

9. A semiconductor device according to claim 5 wherein said metal source electrode has a second portion which is formed on said first surface of said substrate and which forms a second Schottky junction with said first semiconductor layer of said substrate.

10. A semiconductor device according to claim 6 wherein said base region is deeper than said first Schottky junction, and surrounds said first Schottky junction.

11. A semiconductor device according to claim 2 wherein said first portion of said source electrode is in ohmic contact with said source region and said channel region.

12. A semiconductor device according to claim 11 wherein said channel region comprises a highly doped semiconductor base region of said second conductivity type, formed under said source region, and a lightly doped peripheral region surrounding said source and base regions, said first portion of said source electrode extending through said base region.

13. A semiconductor device according to claim 12 wherein said first portion of said source electrode is in ohmic contact with said base region.

14. A semiconductor device according to claim 5 wherein said first semiconductor layer is formed on said second semiconductor layer, and has an impurity concentration lower than that of said second layer.

15. A semiconductor device according to claim 14, wherein said first semiconductor layer is an epitaxial layer grown on said second semiconductor layer.

* * * * *